US007340473B2

(12) United States Patent
Paruthi et al.

(10) Patent No.: US 7,340,473 B2
(45) Date of Patent: Mar. 4, 2008

(54) METHOD AND SYSTEM FOR BUILDING BINARY DECISION DIAGRAMS EFFICIENTLY IN A STRUCTURAL NETWORK REPRESENTATION OF A DIGITAL CIRCUIT

(75) Inventors: Viresh Paruthi, Austin, TX (US); Christian Jacobi, Böblingen (DE); Geert Janssen, Putnam Valley, NY (US); Jiazhao Xu, Mount Kisco, NY (US); Kai Oliver Weber, Stuttgart (DE)

(73) Assignee: International Business Machines Corporation, Armonk, NY (US)

( * ) Notice: Subject to any disclaimer, the term of this patent is extended or adjusted under 35 U.S.C. 154(b) by 592 days.

(21) Appl. No.: 10/926,587

(22) Filed: Aug. 26, 2004

(65) Prior Publication Data

US 2006/0047680 A1   Mar. 2, 2006

(51) Int. Cl.
*G06F 17/50* (2006.01)
(52) U.S. Cl. .......................................... 707/101; 716/3
(58) Field of Classification Search ................ 707/101; 716/2, 3, 5, 6, 17, 19
See application file for complete search history.

(56) References Cited

U.S. PATENT DOCUMENTS

| | | | | |
|---|---|---|---|---|
| 5,649,165 A | * | 7/1997 | Jain et al. ....................... | 716/5 |
| 6,473,884 B1 | * | 10/2002 | Ganai et al. .................... | 716/3 |
| 2003/0123576 A1 | * | 7/2003 | Cleveland et al. ........... | 375/340 |

OTHER PUBLICATIONS

H. Andersen, An Introduction to Binary Decision Diagrams, Technical University of Denmark, Oct. 1997.

R. Bryant, Graph-Based Algorithms for Boolean Function Manipulation.

R. Rudell, Dynamic Variable Ordering for Ordered Binary Decision Diagrams, IEEE, 1993, pp. 42-47.

L. Turbak, Depth-First Search and Related Graph Algorithms, Wellesley College, Nov. 28, 2001.

* cited by examiner

*Primary Examiner*—Chong H Kim
(74) *Attorney, Agent, or Firm*—Casimer K. Salys; Dillon & Yudell LLP (57) ABSTRACT

A method, system and computer program product for building decision diagrams efficiently in a structural network representation of a digital circuit using a dynamic resource constrained and interleaved depth-first-search and modified breadth-first-search schedule is disclosed. The method includes setting a first size limit for a first set of one or more m-ary decision representations describing a logic function and setting a second size limit for a second set of one or more m-ary decision representations describing a logic function. The first set of m-ary decision representations of the logic function is then built with one of the set of a depth-first technique or a breadth-first technique until the first size limit is reached, and a second set of m-ary decision representations of the logic function is built with the other technique until the second size limit is reached. In response to determining that a union of first set and the second set of m-ary decision representations do not describe the logic function, the first and second size limits are increased, and the steps of building the first and second set are repeated. In response to determining that the union of the first set of m-ary decision representations and the second set of m-ary decision representations describe the logic function, the union is reported.

8 Claims, 4 Drawing Sheets

METHOD AND SYSTEM FOR BUILDING BINARY DECISION DIAGRAMS EFFICIENTLY IN A STRUCTURAL NETWORK REPRESENTATION OF A DIGITAL CIRCUIT

BACKGROUND OF THE INVENTION

1. Technical Field

The present invention relates in general to representing logic functions and in particular to representing a logic function in a decision diagram. Still more particularly, the present invention relates to a system, method and computer program product for building decision diagrams efficiently in a structural network representation of a digital circuit, using a dynamic, resource-constrained and interleaved depth-first-search and modified breadth-first-search schedule.

2. Description of the Related Art

Many tasks in computer-aided design (CAD), such as equivalence checking, property checking, logic synthesis and false-paths analysis require Boolean reasoning and analysis on problems derived from representations of circuit structures. One commonly-used approach to Boolean reasoning and analysis for applications operating on representations of circuit structures is to represent the underlying logical problem structurally (as a circuit graph), and then use Binary Decision Diagrams (BDDs) to convert the structural representation into a functionally canonical form.

In such an approach, in which a logical problem is represented structurally and binary decision diagrams are used to convert the structural representation into a functionally canonical form, a set of nodes for which binary decision diagrams are required to be built, called "sink" nodes, are identified. Examples of sink nodes include the output node or nodes in an equivalence checking or a false-paths analysis context. Examples of sink nodes also include targets in a property-checking or model-checking context.

Following identification of the sink nodes, binary decision diagrams for these nodes are built in a topological manner, starting at the input variables for a function. The process of building binary decision diagrams flows from input variables to intermediate nodes in the circuit graph representation until, finally, the binary decision diagrams for the sink nodes are built.

Binary decision diagrams provide an effective tool for Boolean reasoning and analysis in applications operating on representations of circuit structures, but binary decision diagrams frequently suffer from exponential space complexity and associated resource (e.g. memory) consumption. In the worst case, exponential complexity and associated resource consumption preclude completion of binary decision diagrams.

One reason for resource consumption problems in constructing binary decision diagrams relates to reliance on a total order in the Boolean variables in the binary decision diagrams. Another reason that the construction of binary decision diagrams is memory intensive relates to the sheer number of binary decision diagrams that are "alive" at any given time. A binary decision diagram is considered 'alive' if it is still needed to build binary decision diagrams for related fanout nodes. Notably, the order in which binary decision diagrams for the nodes in a circuit graph are built can cause an unnecessarily large number of binary decision diagrams to be alive at any given time. What is needed is a method to reduce the resource consumption in constructing binary decision diagrams by appropriately scheduling construction of binary decision diagrams to reduce the number of nodes that are alive at any given time.

SUMMARY OF THE INVENTION

A method, system and computer program product for building decision diagrams efficiently in a structural network representation of a digital circuit using a dynamic resource constrained and interleaved depth-first-search and modified breadth-first-search schedule is disclosed. The method includes setting a first size limit for a first set of one or more m-ary decision representations describing a logic function and setting a second size limit for a second set of one or more m-ary decision representations describing a logic function. The first set of m-ary decision representations of the logic function is then built with one of the set of a depth-first technique or a breadth-first technique until the first size limit is reached, and a second set of m-ary decision representations of the logic function is built with the other technique until the second size limit is reached. In response to determining that a union of first set and the second set of m-ary decision representations do not describe the logic function, the first and second size limits are increased, and the steps of building the first and second set are repeated. In response to determining that the union of the first set of m-ary decision representations and the second set of m-ary decision representations describe the logic function, the union is reported.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed descriptions of an illustrative embodiment when read in conjunction with the accompanying drawings, wherein:

DETAILED DESCRIPTION OF THE PREFERRED EMBODIMENT

The present invention alleviates the problems of exponential complexity and associated resource consumption by presenting a method and system that compute a heuristically-optimized schedule for efficiently building binary decision diagrams for nodes in a circuit-graph representation of a problem. The technique of the present invention manages available resources more efficiently than conventional techniques, and the present invention reduces the number of live binary decision diagrams, thereby reducing overall memory consumption.

Figure 1:
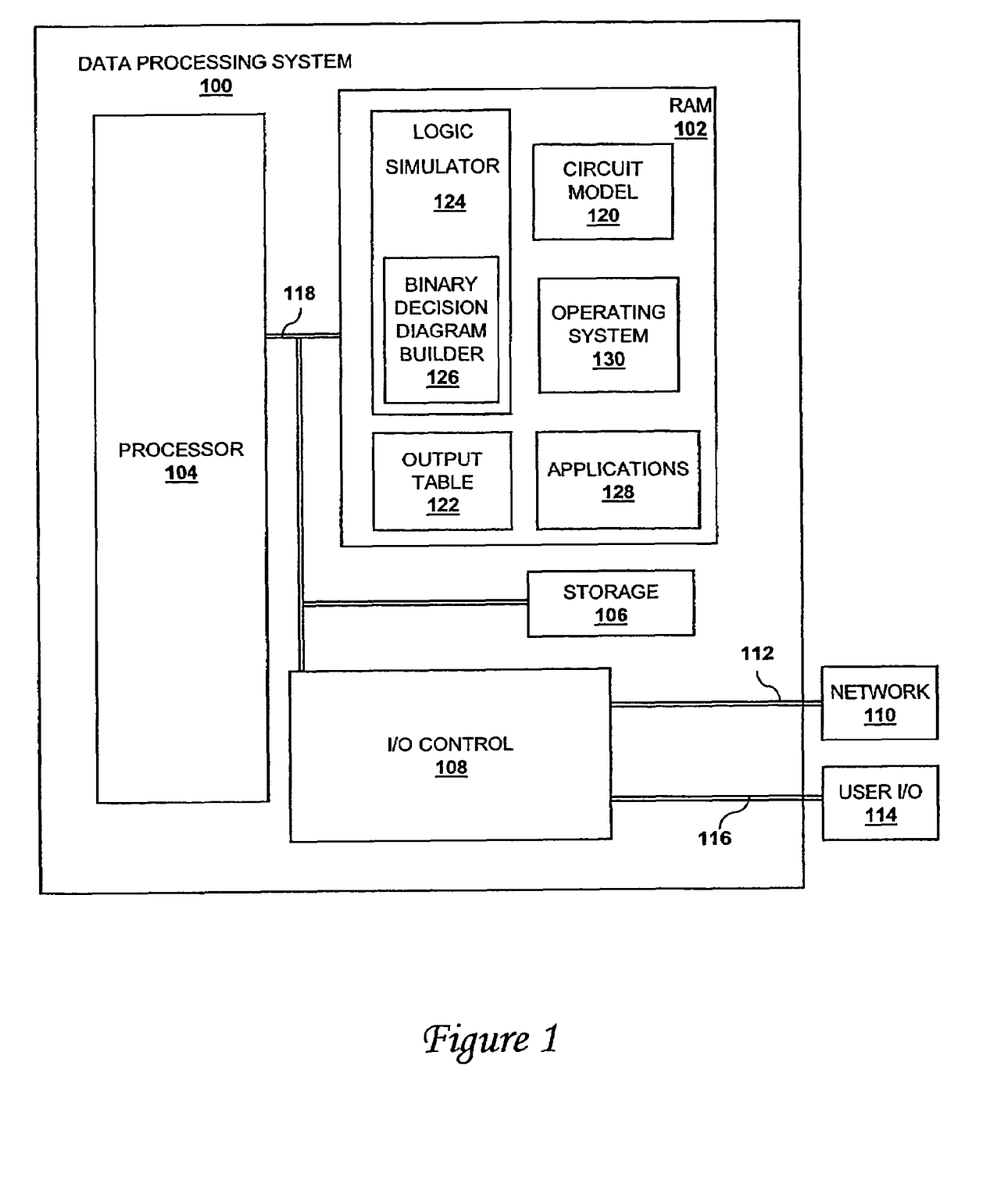
FIG. 1 depicts a block diagram of a data processing system equipped with a computer program product for building binary decision diagrams efficiently in a structural network representation of a digital circuit using a dynamic, resource-constrained and interleaved depth-first-search and modified breadth-first-search schedule, in accordance with a preferred embodiment of the present invention.

With reference now to the figures, and in particular with reference to FIG. 1, a block diagram of a data processing system equipped with computer program product for building binary decision diagrams efficiently in a structural network representation of a digital circuit using a dynamic, resource-constrained and interleaved depth-first-search and modified breadth-first-search schedule, in accordance with a preferred embodiment of the present invention, is depicted. A data processing system 100 contains a processing storage unit (e.g., RAM 102) and a processor 104. Data processing system 100 also includes non-volatile storage 106 such as a hard disk drive or other direct access storage device. An Input/Output (I/O) controller 108 provides connectivity to a network 110 through a wired or wireless link, such as a network cable 112. I/O controller 108 also connects to user I/O devices 114 such as a keyboard, a display device, a mouse, or a printer through wired or wireless link 116, such as cables or a radio-frequency connection. System interconnect 118 connects processor 104, RAM 102, storage 106, and I/O controller 108.

Within RAM 102, data processing system 100 stores several items of data and instructions, while operating in accordance with a preferred embodiment of the present invention. These include a circuit model 120 and an output table 122 for interaction with a logic simulator 124, containing a binary decision diagram builder 126. Other applications 128 and logic simulator 124 interface with processor 104, RAM 102, I/O control 108, and storage 106 through operating system 130. One skilled in the data processing arts will quickly realize that additional components of data processing system 100 may be added to or substituted for those shown without departing from the scope of the present invention.

Processor 104 executes instructions from programs, often stored in RAM 102, in the course of performing the present invention. In a preferred embodiment of the present invention, processor 104 executes logic simulator 124. Logic simulator 124 performs the creation of binary decision diagrams through the operation of binary decision diagram builder 126 on the circuit specifications contained in circuit model 120, which contains instructions for modeling a simulated item of logical hardware.

Logic simulator 124 includes a computer program product, stored in RAM 102 and executed on processor 104, which provides a series of tools for activities such as equivalence checking, property checking, logic synthesis and false-paths analysis. Generally speaking, logic simulator 124 contains rule-based instructions for predicting the behavior of logically modeled items of hardware. Logic simulator 124 uses the series of rules contained in its own instructions, in conjunction with circuit model 120, to represent the underlying logical problem structurally (as a circuit graph), and uses binary decision diagram builder 126 to construct binary decision diagrams, thereby converting the structural representation into a functionally canonical form.

Circuit model 120 may model the designs of many different kinds of logical hardware, but preferably provides a software representation of components such as microprocessors and application specific integrated circuits (ASICs).

Binary decision diagram builder 126 records binary decision diagrams to output table 122, a result recording file. Logic simulator 124 may also report the contents of output table 122 or the status selected indicators of the status of circuit model 120 to user I/O 114 or applications 128. Additionally, all or part of logic simulator 124, operating system 130, circuit model 120, and output table 122 may, at times, be stored in storage 106 or in RAM 102.

A netlist graph is a popular means of compactly representing problems derived from circuit structures in computer-aided design of digital circuits. Such a representation is non-canonical and offers limited ability to analyze the function from the nodes in the graph. Binary decision diagrams are a popular choice for efficiently applying Boolean reasoning to problems derived from circuit structures, which are frequently represented in net list graphs. Binary decision diagrams offer a compact and canonical representation of the Boolean function of a graph node, which expedites reasoning regarding a node's function. Unfortunately, the size of binary decision diagrams, and hence the complexity of manipulating them, is very sensitive to the order in which variables appear in the binary decision diagrams. Binary decision diagrams suffer from exponential complexity in the worst case. Binary decision diagram packages, such as a binary decision diagram builder 126, which implement binary decision diagram building and manipulation algorithms, use Dynamic Variable Ordering (DVO) algorithms to periodically reduce the number binary decision diagram nodes. These algorithms tend to be expensive in both time and space complexity and binary decision diagram packages rely on heuristics to compute a local minimum size, as opposed to a preferable global minimum. Generally, computing a global minimum is prohibitively expensive for use in reducing the number of binary decision diagram nodes. Hence, starting with a reasonable initial size and computing a good order when the number of binary decision diagram nodes is relatively small, is strongly suggested.

A set of nodes for which binary decision diagrams are needed, called sinks, are identified. A natural way to build binary decision diagrams for sink nodes is to use a depth-first-search (DFS) schedule, which builds binary decision diagrams for each sink node successively. For each sink node, the technique of the preferred embodiment traverses the circuit graph in a depth-first-search manner and builds binary decision diagrams for nodes in a bottom-up fashion, starting at the inputs.

The present invention includes a method and system, which employ a combination of depth-first and modified breadth-first methods, working in tight integration and in a resource-constrained manner, to build binary decision diagrams of logical functions and the sub-functions of logical functions. In a preferred embodiment of the present invention, binary decision diagrams are efficiently built by binary decision diagram builder 126 for designated sink nodes contained within a structural graph representation of a problem derived from circuit structure. By switching between depth-first and modified breadth-first methods for building binary decision diagrams, the method of the preferred embodiment dynamically adjusts resource utilization parameters to converge on a heuristically-optimized schedule.

The method of the preferred embodiment allows binary decision diagram builder 126 to suspend construction of a given binary decision diagram by either of a depth-first or a breadth-first method, when the binary decision diagram under construction exceeds a certain pre-determined size threshold, and return later, with higher resource limits, to building the abandoned binary decision diagram. In this manner, by building smaller binary decision diagrams first, the preferred embodiment enables use of Dynamic Variable Ordering (DVO) algorithms, which attempt to compute a variable order that reduces the number of live binary decision diagram nodes, to converge on the best order needed for building all of the binary decision diagrams needed for a particular circuit. The method of building binary decision diagrams of the present invention is optimized by building smaller binary decision diagrams before building larger binary decision diagrams. Building smaller builder decision diagrams before building larger builder decision diagrams significantly reduces overall runtime and memory requirements.

Additionally, by completing all of the less challenging binary decision diagrams, the number of alive binary decision diagram nodes is minimized. Furthermore, efficient constant propagation is guaranteed by the preferred embodiment's resource-constrained method. The overall scheme interleaves a depth-first approach, which computes a schedule from the output toward the inputs, with a topologically adhered breadth-first approach. The combination of breadth-first and depth-first construction operates from the inputs toward the outputs in a levelized manner, combining the strengths and advantages of both depth-first and breadth-first operations.

The present invention combines both the depth-first search and the breadth-first-search schemes into a novel scheme that takes advantage of the benefits of both, and alleviates some of the drawbacks of each, through combination. In particular, the method of the present invention sets a size threshold on the sizes of binary decision diagrams that can be built at any given stage, and this threshold is progressively increased until binary decision diagrams for all sink nodes have been built. The algorithm starts by building binary decision diagrams for graph nodes in a depth-first search manner. As soon as the size of a binary decision diagram exceeds a specified size threshold, the method of the present invention temporarily abandons building the binary decision diagram for this node and moves on to the next node in the depth-first search schedule. Once binary decision diagram building for all nodes has been attempted, the method of the preferred embodiment switches to a breadth-first-search schedule. After attempting to build binary decision diagrams up to the specified size threshold with a breadth-first-search schedule, the method of the present invention resets the size threshold and again attempts a depth-first search schedule with the higher threshold.

This process is continued until binary decision diagrams for all sink nodes have been built though the method may be abandoned if the specified overall resources (e.g., upper limit on the number of binary decision diagram nodes) are exhausted. Such an interleaved depth-first search/breadth-first-search, resource-constrained scheme has several advantages.

Figure 2:
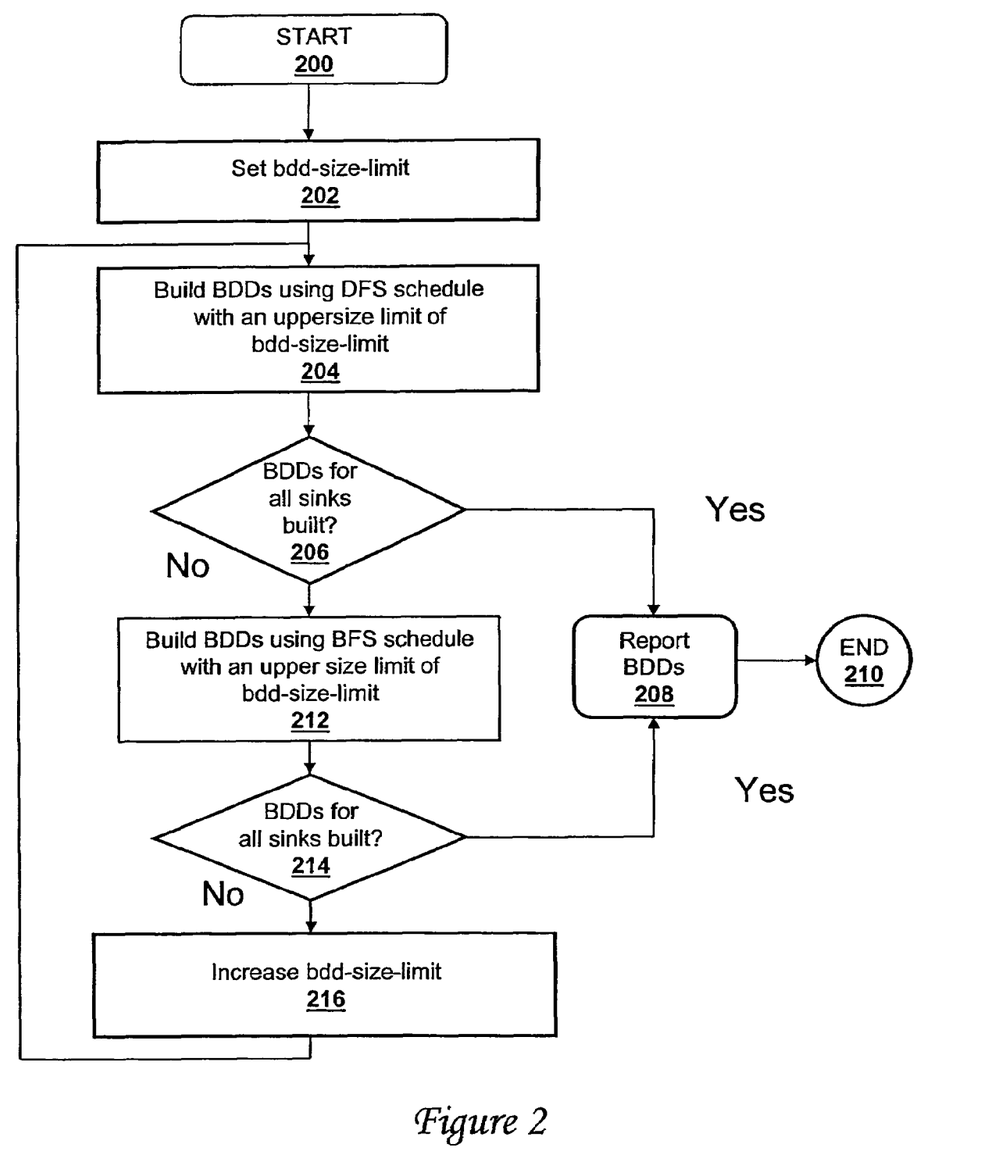
FIG. 2 is a high-level logical flowchart of a process for building binary decision diagrams efficiently in a structural network representation of a digital circuit using a dynamic resource-constrained and interleaved depth-first-search and modified breadth-first-search schedule, in accordance with a preferred embodiment of the present invention.

With reference now to FIG. 2, there is depicted a high-level logical flowchart of a process for building binary decision diagrams efficiently in a structural network representation of a digital circuit using a dynamic, resource-constrained and interleaved depth-first-search and modified breadth-first-search schedule, in accordance with a preferred embodiment of the present invention.

The process begins at step 200, which depicts activating a computer program product for building binary decision diagrams efficiently in a structural network representation of a digital circuit using a dynamic resource constrained interleaved depth-first-search and modified breadth-first-search schedule. This will typically happen when logic simulator 124 in RAM 102 receives an instruction to build a binary decision diagram from a structural representation of a logical function and invokes binary decision diagram builder 126.

The process then proceeds to step 202, which depicts binary decision diagram builder 126 setting an upper limit for the size of a binary decision diagram. Because both depth-first construction and breadth-first construction are used, the upper limit for the size of a binary decision diagram is specified by one or more variables, a first variable representing the size limit in depth-first operations and the same or a second variable representing the size limit in breadth-first operations. In order to set the upper size limit, binary decision diagram builder 126 will first mark the cone of influence of all sink nodes, and then obtain a schedule by determining the order in which nodes of the binary decision diagrams will be built. Scheduling of nodes is achieved by means of a depth-first and breadth first search on the circuit represented by a netlist graph in circuit model 120. Binary decision diagram builder 126 then declares binary decision diagram variables for variables in the cone-of-influence of the sink nodes. Setting the upper limit for a binary decision diagram regulates the resources that logic simulator 124 allows binary decision diagram builder 126 to use for building binary decision diagrams in later stages of the process depicted in FIG. 2.

The process then moves to step 204, which depicts binary decision diagram builder 126 building binary decision diagrams using a depth-first schedule with an upper size limit set by logic simulator 204. Binary decision diagram builder 126 creates binary decision diagrams for nodes using a depth-first search schedule with an upper limit on the binary decision diagram size equal to binary decision diagram upper-size-limit. If the binary decision diagram size exceeds this limit, binary decision diagram builder 126 moves to the next node in the schedule. During the building process, logic simulator 124 checks to see if binary decision diagrams of all fanouts of a given node have been built. If so, logic simulator 124 frees the binary decision diagram for the nodes.

Once the binary decision diagrams for all the fanouts of a node have been built, the binary decision diagram for that node can be freed or dereferenced. Freeing unneeded binary decision diagrams keeps the number of binary decision diagram nodes in binary decision diagram builder 126 to a minimum, such that expensive binary decision diagram operations such as DVO are not impacted by the presence of spurious nodes. Moreover, many applications set an upper limit on the number of binary decision diagram nodes allowed to exist at any one time. A limit on nodes prevents a "runaway" binary decision diagram operation, and the presence of spurious binary decision diagrams may cause such limit to be reached prematurely and inaccurately. Reaching the limit prematurely and inaccurately may prohibit completion of a computation that might be otherwise be completed. Even if an application does not set an upper limit, there may be an upper limit on the number of binary decision diagram nodes that can exist at any point in time in a binary decision diagram package due to the data structures used, or due to the available memory on the machine.

An advantage of the depth-first style of building binary decision diagrams is a reduced peak or maximum in the number of alive binary decision diagram nodes. Because binary decision diagrams for a single sink are built serially, binary decision diagrams for only those circuit graph nodes that lie in the cone-of-influence of a given sink are required to be built simultaneously. Unfortunately, the advantage in reduction of the peak or maximum in the number of alive binary decision diagram nodes must be balanced against the need to retain binary decision diagrams for nodes that lie in the cone-of-influence of other sink nodes.

The failure to retain binary decision diagrams for nodes that lie in the cone-of-influence of other sink nodes may potentially free binary decision diagrams for those nodes, only to require binary decision diagram builder 126 to build them again later. Rebuilding binary decision diagrams for nodes that lie in the cone-of-influence of other sink nodes wastes time and resources through repetition. Additionally, a depth-first search technique may use unnecessary resources and time as it builds binary decision diagrams for a single sink node at a time, especially if binary decision diagrams for nodes that lie in the cone-of-influence of more than one sink node are recomputed (in an attempt to keep memory usage low, as explained above) when computing the binary decision diagram for each sink node.

The process then proceeds from step 204 to step 206, which depicts binary decision diagram builder 126 determining whether all binary decision diagrams for all sinks were completed. If binary decision diagrams for all sinks have been built, the process then moves to step 208, which depicts binary decision diagram builder 126 reporting the completed binary decision diagrams. Reporting may include recording binary decision diagrams to output table 122, a result recording file. Logic simulator 124 may also report the contents of output table 122 or the status selected indicators of the status of circuit model 120 to user I/O 114 or applications 128. After reporting is finished in step 208, the process ends at step 210.

If, in step 206, binary decision diagram builder 126 determines that binary decision diagrams for all sink nodes have not been completed, the process then proceeds to step 212, which depicts binary decision diagram builder 126 building binary decision diagrams on a breadth-first-search routine until reaching the upper limit set by discussed above. Binary decision diagram builder 126 creates binary decision diagrams for nodes using a breadth-first-search schedule with an upper limit on the binary decision diagram size equal to an upper size limit of the binary decision diagram. If the binary decision diagram size exceeds this limit, logic simulator 124 moves on the next node in the schedule. During the building process, logic simulator 124 checks to see if binary decision diagrams of all fanouts of the fanins of a completed node have been built, and if so, frees the resources used for the node.

Logic simulator 124 employs a topologically adhered breadth-first-search (BFS) schedule to build binary decision diagrams for the designated sink nodes in a levelized manner, starting at the inputs. The level of a node (v) in a circuit graph is defined as follows:
level(v)=0, if v is an input
max(level of all the fanins of the node)+1

In a breadth-first-search technique, nodes at different levels are gathered together. The binary decision diagrams are then built progressively at each level, starting at the inputs. As in the depth-first search approach, once binary decision diagrams for all fanouts of a node have been built, the binary decision diagram for that node can be freed. The breadth-first-search scheme offers the advantage of speed, because binary decision diagrams for all sink nodes are built in a single pass. Unfortunately, a breadth-first-search can become expensive in terms of space, compared to a depth-first search style of building binary decision diagrams, because the breadth-first-search requires that the binary decision diagram for a node be kept alive until binary decision diagrams for all fanout nodes of the first node have been built. As can be expected, a breadth-first search scheme may involve a higher peak number of binary decision diagram nodes. Many binary decision diagrams are later "multiplexed" away as fanouts of nodes are processed, and subsequently binary decision diagrams of nodes at lower levels are freed. The fanouts of a node may span many levels.

The process then proceeds from step 212 to step 214, which depicts logic simulator 124 determining whether all whether binary decision diagrams for all sinks were completed. If binary decision diagrams for all sinks have been built, the process then moves to step 208, which depicts logic simulator 124 reporting the completed binary decision diagrams, as described above. After reporting is finished in step 208, the process ends at step 210.

If, in step 214, logic simulator 124 determines that binary decision diagrams for all sink nodes have not been completed, the process then proceeds to step 216, which depicts logic simulator 124 increasing the upper size limit for binary decision diagrams. The process then returns to step 204, which depicts binary decision diagram builder 126 building binary decision diagrams on a depth-first schedule with an upper size limit set by logic simulator 204, as described above.

Figure 3:
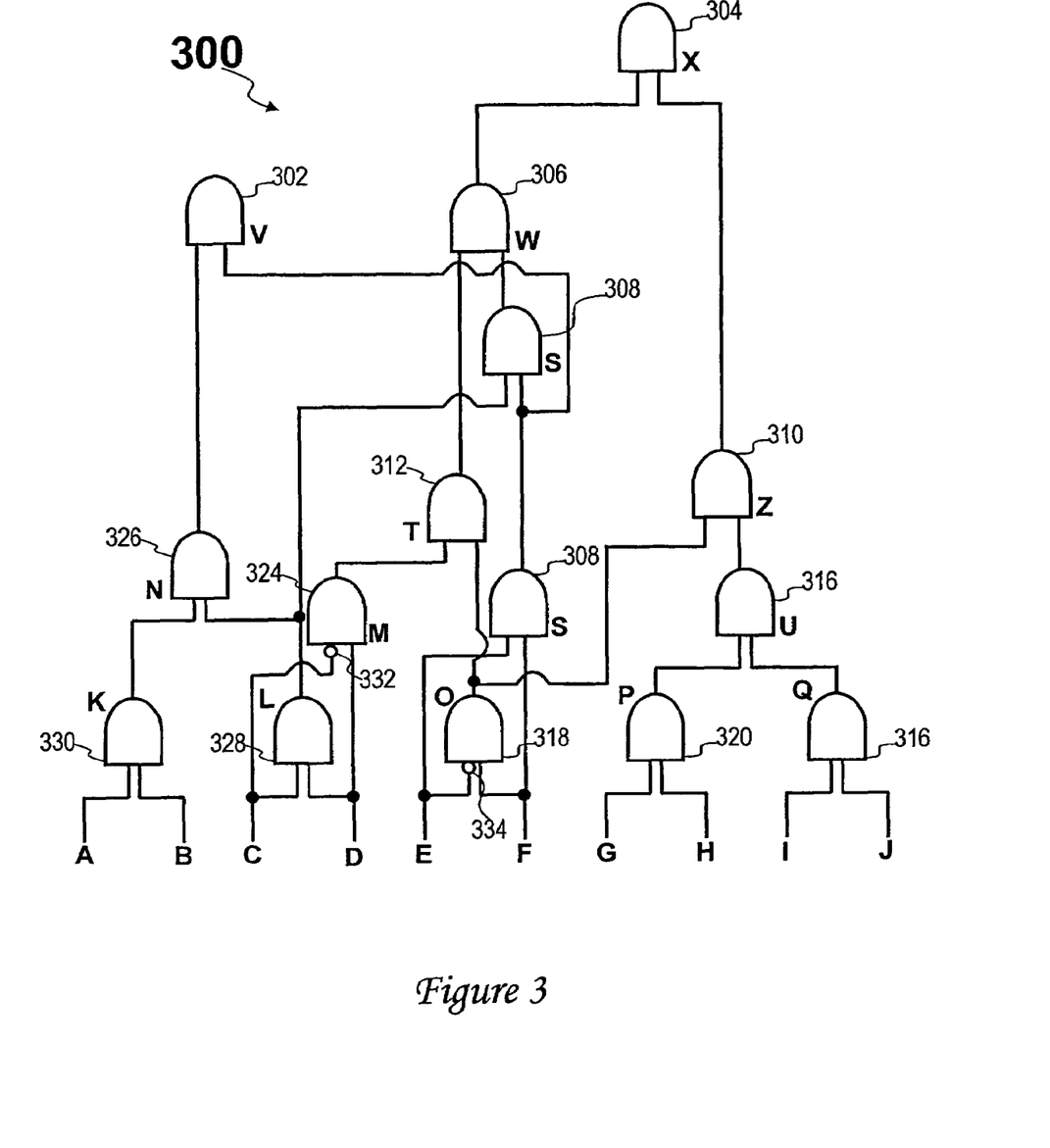
FIG. 3 represents an exemplary circuit, which is analyzed in accordance with a preferred embodiment of the present invention.

Turning now to FIG. 3, an exemplary circuit, which is analyzed in accordance with the preferred embodiment of the present invention, is depicted. As illustrated, circuit 300 contains a collection of interconnected AND gates 302-330. Inverted inputs 332 and 334 provide one signal to each of AND gates 318 and 324. Circuit 300 takes data at input nodes A-J and outputs results at nodes K-Z. Of result nodes K-Z, node V and node X represent final outputs, which are sinks of the functions represented by circuit 300.

Figure 4:
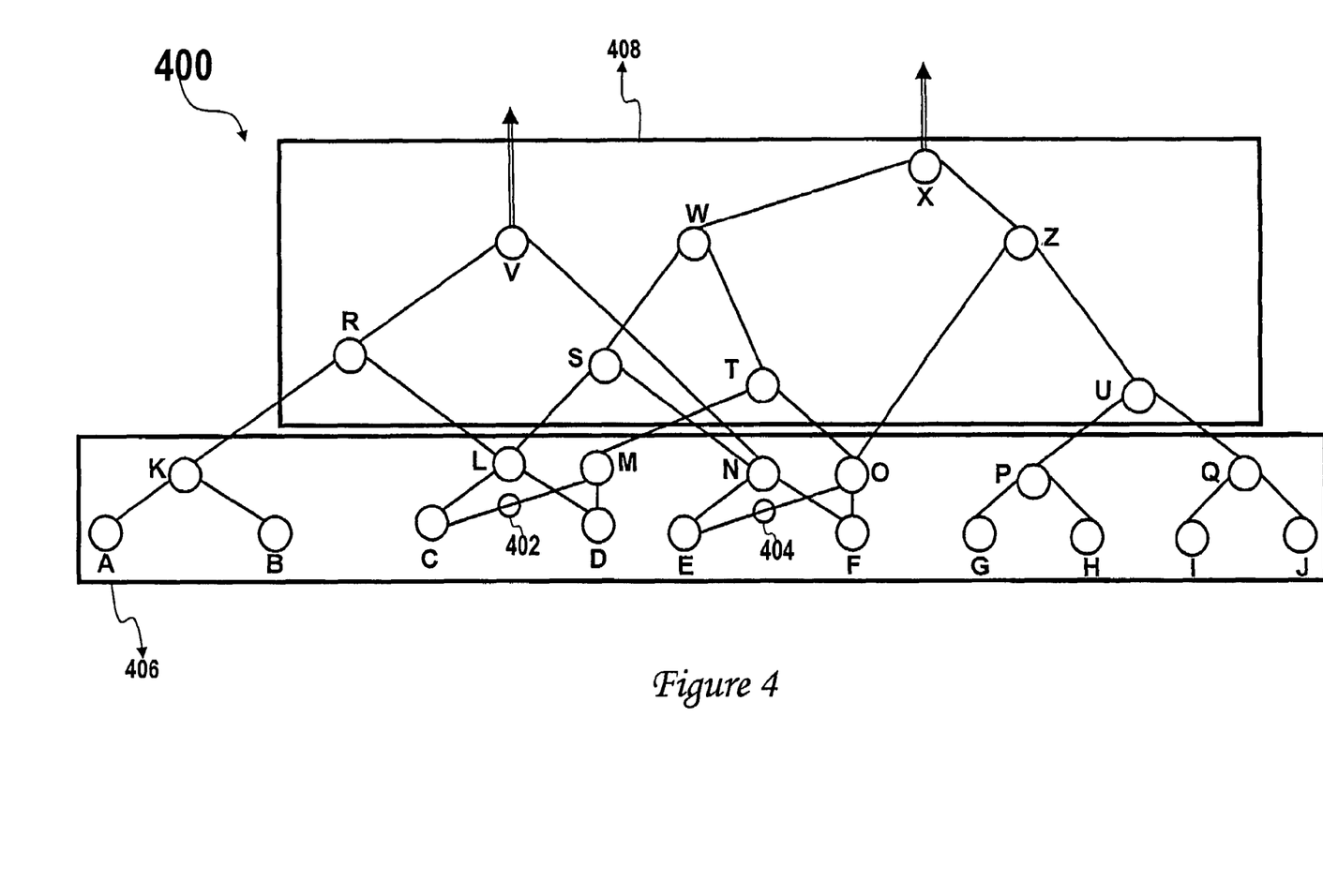
FIG. 4 is an exemplary binary decision diagram constructed in accordance with a preferred embodiment of the present invention.

With reference now to FIG. 4, an exemplary binary decision diagram of circuit 400 constructed in accordance with a preferred embodiment of the present invention is depicted. As illustrated, binary decision diagram 400 contains a collection of input nodes A-J and result nodes K-Z. Each of result nodes K-Z corresponds to the output node of one of the set of AND gates 302-330 depicted in FIG. 3. Because of inverted inputs 332 and 334, node M receives an input from node C that is inverted at inversion edge 402, and node O receives an input from node E that is inverted at inversion edge 404. As in FIG. 3, Node V and node X represent final outputs, which are sinks of the functions represented by binary decision diagram 400.

Given a representation of a circuit 300 in circuit model 120, binary decision diagram builder 126 builds binary decision diagram 400 through the series of steps shown in FIG. 2 and described above. First, logic simulator 124 in RAM 102 receives an instruction to build a binary decision diagram 400 from a structural representation of circuit 300 and invokes binary decision diagram builder 126. Then binary decision diagram builder 126 setting an upper limit for the size of a binary decision diagram. In the example represented with respect to FIG. 4, the binary decision diagram size limit (bdd-size-limit) is set to 2 for exemplary simplicity, though one skilled in the art will quickly realize that actual embodiments typically use much larger binary decision diagram size limits.

Binary decision diagram builder 126 then builds binary decision diagram 400 using a depth-first schedule with an upper size limit set of two. For each node, if the binary decision diagram size exceeds this limit, binary decision diagram builder 126 moves to the next node in the schedule. During the building process, logic simulator 124 checks to see if binary decision diagrams of all fan-outs of a given node have been built. If so, logic simulator 124 frees the binary decision diagram for the nodes. Building nodes on the depth-first-schedule builds a first binary decision diagram group 406 containing nodes K=A&B, L=C&B, M=NOT(C) &D, N=E&F, O=NOT(E)&F, P=G&H, and Q=I&J. Logic simulator 124 then checks to see if binary decision diagrams of all fan-outs of nodes A-J have been built. Because all fan-outs of nodes A-J have been built, logic simulator 124 frees the binary decision diagrams for nodes A-J. Because binary decision diagram builder 126 has not completed building binary decision diagrams for nodes V and X, binary decision diagram construction continues with a breadth-first method.

Binary decision diagram builder 126 then builds binary decision diagram 400 using a breadth-first schedule with an upper size limit set of four. For each node, if the binary decision diagram size exceeds this limit, binary decision diagram builder 126 moves to the next node in the schedule. During the building process, logic simulator 124 checks to see if binary decision diagrams of all fan-outs of a given node have been built. If so, logic simulator 124 frees the binary decision diagram for the nodes. Building nodes on the breadth-first-schedule builds a second binary decision diagram group 408 containing nodes R=A&B&C&D, S=F&E&C&D, T=NOT(C)&D&NOT(E)&F, U=G&H&I&J, W=0, X=0. Logic simulator 124 then checks to see if binary decision diagrams of all fan-outs of nodes K-W have been built. Because all fan-outs of nodes K, L, M, N, P, Q, S, T, and W have been built, logic simulator 124 frees the binary decision diagrams for nodes K, L, M, N, P, Q, S, T, and W. Because binary decision diagram builder 126 has not completed building binary decision diagrams for node V, binary decision diagram construction continues with a depth-first method after the maximum size of a depth-first binary decision diagram 400 is increased to six.

Binary decision diagram builder 126 then builds binary decision diagram 400 using a depth-first schedule with an upper size limit set of six. For each node, if the binary decision diagram size exceeds this limit, binary decision diagram builder 126 moves to the next node in the schedule. During the building process, logic simulator 124 checks to see if binary decision diagrams of all fan-outs of a given node have been built. If so, logic simulator 124 frees the binary decision diagram for the nodes. Building nodes on the depth-first-schedule builds a third binary decision diagram group containing node V=A&B&C&D&E&F. Because node V is the last node of binary decision diagram 400, binary decision diagram builder can then report the completed binary decision diagram 400 to output table 122.

The present invention ameliorates the problems of exponential complexity and associated resource consumption by presenting a method and system that compute a heuristically-optimized schedule for efficiently building binary decision diagrams for nodes in a circuit-graph representation of a problem. The technique of the present invention manages available resources efficiently, and the present invention minimizes the number of live binary decision diagrams, thereby reducing overall memory consumption.

Among the specific advantages of the method described with respect to FIG. 2, resource-constrained interleaving handles constant propagation efficiently. Individually, both the depth-first search and breadth-first-search algorithms described above suffer from a drawback where constants are not fully employed. More specifically, situations occur, which involve a function at a sink node is a constant due to a fan-in node function (e.g., a case involving an AND gate with one input permanently at '0', leaving the function at the AND gate at '0'), but previous algorithms would expend resources computing the binary decision diagrams of the other fan-in nodes. The resource-constrained scheme of the preferred embodiment imposes a size limit on the number of nodes that a binary decision diagram for a circuit graph node can employ. If the limit is exceeded, the scheme suspends building the binary decision diagrams for a node and progresses to the next node in the schedule. Hence, with regard to the example of an AND gate with a constant input at 0, the preferred embodiment progresses to the fan-in node of the gate that is a constant quickly. The resource limit ideally tends to be set to a small value at early stages of the process, which causes the gate function to be computed (a constant 0 for the AND gate) without the need to compute binary decision diagrams of the other fan-in nodes.

In the preferred embodiment, the peak number of binary decision diagram nodes in the binary decision diagram package will be much lower than in prior art approaches. The interleaved depth-first-search and breadth-first-search resource-constrained scheme detailed above ensures that nodes that have small binary decision diagrams can be computed early in the process, and subsequently freed, to make resources available for larger binary decision diagrams. Later, extensive binary decision diagram operations, such as DVO or Garbage Collection that check for nodes that can be freed, benefit from a reduced number of alive binary decision diagram nodes reducing overall runtime and memory requirements.

The interleaved scheme brings together both a depth-first search and a breadth-first-search scheme in tight integration combining the advantages of both. The new scheme works in a "push-pull" manner by going back and forth between the two schemes ensuring that the benefit of each scheme is realized during the respective phase, and giving the best overall performance. Indeed, the depth-first search or the "pull" uncovers any paths building binary decision diagrams along which building the binary decision diagram for a sink node may suffice, while the "push" or the levelized breadth-first-search traversal causes binary decision diagrams to be propagated quickly from the inputs towards the outputs with a tight control on consumed resources. The resource limit further ensures that the overall algorithm does not get stuck in any one computation that does not contribute to the final result. The order of breadth first and depth-first searching can be reversed from that described above without departing from the scope of the invention.

While this invention has been particularly shown as described with reference to a preferred embodiment, it will be understood by those skilled in the art that various changes in form and detail may be made therein without departing from the spirit and scope of the invention. It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communication links.

What is claimed is:

1. A method for efficiently producing a description of a logic function in m-ary decision representations, said method comprising:

setting a first size limit for a first set of one or more m-ary decision representations describing a logic function;

setting a second size limit for a second set of one or more m-ary decision representations describing a logic function;

building said first set of m-ary decision representations of said logic function with one of the set of a depth-first technique or a breadth-first technique until said first size limit is reached;

building a second set of m-ary decision representations of said logic function with the other of the set of a depth-first technique or a breadth-first technique until said second size limit is reached;

in response to determining that a union of first set and said second set of m-ary decision representations do not describe said logic function, increasing said first size limit, increasing said second size limit, and repeating said step of building said first set and said step of building said second set; and in response to determining that said union of said first set of m-ary decision representations and said second set of m-ary decision representations describes said logic function, reporting the union of said first set of m-ary decision representations and said second set of m-ary decision representations to an output file.

2. The method of claim 1, further comprising:

in response to determining, during one of the set of said step of building said first set of m-ary decision representations or said step of building said second set m-ary decision representations, that the union of said first set of m-ary decision representations and said second set of m-ary decision representations describes said logic function, suspending said one of the set of said step of building said first set of m-ary decision representations or said step of building said second set m-ary decision representations and reporting the union of said first set of said first set of m-ary decision representations and said second set of m-ary decision representations.

3. The method of claim 1, wherein:

said step of increasing said first size limit further comprises doubling said first size limit; and said step of increasing said second size limit further comprises doubling said second size limit.

4. The method of claim 1, wherein:

said step of building said first set of m-ary decision representations of said logic function further comprises building a first set of binary decision representations of said logic function and sub-functions; and said step of building said second set of m-ary decision representations of said logic function further comprises building a second set of binary decision representations of said logic function and sub-functions.

5. The method of claim 1, wherein:

said step of building said first set of m-ary decision representations of said logic function further comprises building a first set of m-ary decision diagrams of said logic function; and said step of building said second set of m-ary decision representations of said logic function further comprises building a second set of m-ary decision diagrams of said logic function.

6. The method of claim 1, wherein:

said step of determining that said union of said first set of m-ary decision representations and said second set of m-ary decision representations describes said logic function further comprises determining that said union of said first set of m-ary decision representations and said second set of m-ary decision representations contains binary decision diagrams for all sinks in said logic function.

7. The method of claim 1, wherein:

said step of building a second set of m-ary decision representations of said logic function with the other of the set of a depth-first technique or a breadth-first technique until said second size limit is reached further comprises, in response to determining that said first set does not describe said logic function, building a second set of m-ary decision representations of said logic function with the other of the set of a depth-first technique or a breadth-first technique until said second size limit is reached.

8. The method of claim 1, wherein:

said step of determining that said first set do not describe said logic function further comprises determining that said first set of m-ary decision representations does not contain binary decision diagrams for all sinks in said logic function; and said step of determining that a union of first set and said second set of m-ary decision representations does not describe said logic function further comprises determining that said union of said first set of m-ary decision representations and said second set of m-ary decision representations does not contain binary decision diagrams for all sinks in said logic function.

* * * * *